(12) United States Patent
Litzinger et al.

(10) Patent No.: US 9,804,209 B2
(45) Date of Patent: Oct. 31, 2017

(54) MONITORING AN ELECTRICAL POWER SUPPLY NETWORK

(75) Inventors: Andreas Litzinger, Fuerth (DE); Stefan Piel, Essen (DE)

(73) Assignee: SIEMENS AKTIENGESELLSCHAFT, Munich (DE)

( * ) Notice: Subject to any disclaimer, the term of this patent is extended or adjusted under 35 U.S.C. 154(b) by 359 days.

(21) Appl. No.: 14/382,058

(22) PCT Filed: Feb. 29, 2012

(86) PCT No.: PCT/EP2012/053408
§ 371 (c)(1),
(2), (4) Date: Aug. 29, 2014

(87) PCT Pub. No.: WO2013/127447
PCT Pub. Date: Sep. 6, 2013

(65) Prior Publication Data
US 2015/0008898 A1   Jan. 8, 2015

(51) Int. Cl.
*G01R 21/00* (2006.01)
*G01R 23/02* (2006.01)
*H02J 13/00* (2006.01)
*H02J 3/04* (2006.01)
*H02J 3/38* (2006.01)

(52) U.S. Cl.
CPC ........... *G01R 21/006* (2013.01); *G01R 23/02* (2013.01); *H02J 3/04* (2013.01); *H02J 13/001* (2013.01); *H02J 13/0006* (2013.01); *H02J 2003/388* (2013.01); *Y02E 60/74* (2013.01); *Y04S 10/30* (2013.01); *Y04S 10/40* (2013.01)

(58) Field of Classification Search
CPC ...... G01R 23/02; G01R 31/08; G01R 31/081; G01R 31/086; H02J 3/04; H02J 3/38; H02J 3/381; H02J 3/382; H02J 3/383; H02J 3/386; H02J 2003/388
See application file for complete search history.

(56) References Cited

U.S. PATENT DOCUMENTS

| | | | |
|---|---|---|---|
| 6,219,623 B1 * | 4/2001 | Wills | H02J 3/383 290/40 B |
| 2003/0218888 A1 * | 11/2003 | Suzui | H02J 3/1835 363/34 |
| 2004/0021470 A1 | 2/2004 | Adams et al. | |

(Continued)

FOREIGN PATENT DOCUMENTS

WO       0182444 A1    11/2001

*Primary Examiner* — Huy Q Phan
*Assistant Examiner* — David Frederiksen
(74) *Attorney, Agent, or Firm* — Laurence Greenberg; Werner Stemer; Ralph Locher

(57) ABSTRACT

A method and a device are provided for monitoring an electrical power supply network. A temporal frequency change value is determined for at least two sections or for at least two points of the power supply network. The frequency change value indicates the respective temporal frequency change of the network frequency. A conclusion is drawn regarding a possible islanding within the power supply network, and a warning signal which indicates the possible islanding within the power supply network is generated when the difference between the frequency change values, exceeds a predetermined frequency change threshold value.

11 Claims, 3 Drawing Sheets

(56) References Cited

U.S. PATENT DOCUMENTS

| | | | |
|---|---|---|---|
| 2007/0100504 A1* | 5/2007 | Moxley | H02H 3/46 700/286 |
| 2007/0103004 A1* | 5/2007 | Chou | H02J 3/38 307/64 |
| 2007/0143044 A1* | 6/2007 | Huang | H02J 3/38 702/60 |
| 2008/0179966 A1 | 7/2008 | Horio et al. | |
| 2008/0204044 A1* | 8/2008 | Ponnaluri | H02J 3/38 324/647 |
| 2010/0286838 A1* | 11/2010 | Guzman-Casillas | G01R 19/2513 700/293 |
| 2011/0309690 A1* | 12/2011 | West | H02J 3/383 307/125 |
| 2013/0058139 A1* | 3/2013 | Bae | H02H 3/38 363/55 |
| 2013/0155734 A1* | 6/2013 | El-Barbari | H02J 3/383 363/55 |
| 2013/0169309 A1* | 7/2013 | Bickel | H02J 3/46 324/764.01 |

* cited by examiner

MONITORING AN ELECTRICAL POWER SUPPLY NETWORK

BACKGROUND OF THE INVENTION

Field of the Invention

The invention relates to a method for monitoring an electrical power supply network.

As is known, in the event of an overload an electrical power supply network originally synchronous with respect to its network frequency can be separated into individual electrical islands which are no longer intrinsically synchronous as a consequence of automatic opening of corresponding switching connections after defined electrical threshold values have been determined. Owing to the equilibrium between electrical power generation and electrical power consumption no longer being guaranteed in the individual zones of the power supply network immediately after islanding, after a certain delay a network frequency individual to the island or characteristic of the respective island in each case is established in the individual islands—determined by the self-regulating effect of the power supply network and the use of primary regulation of the power generators present in the power supply network. The network frequency must be reduced again to the respective frequency target value of, by way of example, 50 Hz or 60 Hz as promptly as possible with the power generation units available within the respective island section in order to prevent complete breakdown of the electrical power supply network or damage to the large electrical components forming part of the power supply network.

BRIEF SUMMARY OF THE INVENTION

According to this the object of the invention is to disclose a method for monitoring an electrical power supply network which can quickly and reliably indicate possible islanding within the power supply network.

This object is achieved according to the invention by a method having the features as claimed. Advantageous embodiments of the inventive method are disclosed in the subclaims.

According to this it is provided according to the invention that a temporal frequency change value is determined for at least two sections or for at least two points of the power supply network, which value indicates the respective temporal frequency change in the network frequency, and a conclusion is drawn regarding possible islanding within the power supply network, and a warning signal which indicates the possible islanding within the power supply network is generated if the difference between the frequency change values exceeds a predetermined frequency change threshold value.

A fundamental advantage of the inventive method can be seen in that possible islanding can be detected and displayed especially quickly since the temporal frequency change in the network frequency is evaluated for different points of the power supply network and the situation is monitored to see if a predetermined frequency change threshold value is exceeded. The inventors have found that by monitoring the frequency change values of different points of the power supply network possible islanding can be detected especially quickly and reliably.

The power supply network is preferably a distribution network, for example a distribution network of the medium voltage level or a distribution network of the low voltage level, or a transportation network, for example a transportation network of the high voltage level or a high voltage network.

The frequency change values for the at least two sections or for the at least two points are preferably measured by direct measurement of the frequency change values in these at least two sections or at these at least two points.

With respect to the formation of the frequency change values, it is deemed advantageous if the network frequencies are each measured for the at least two sections or for the at least two points of the power supply network by forming a time-dependent frequency value, and the time-dependent frequency values are derived with respect to time by forming one of the temporal frequency change values respectively.

A conclusion is preferably drawn regarding the existence of islanding within the power supply network and an islanding signal indicating islanding within the power supply network is generated if the difference between the frequency values exceeds a predetermined frequency threshold value.

After forming the islanding signal, the islanding signal is preferably only reset again or switched off if the difference between the frequency values falls below a predetermined first resetting threshold value, and the difference between the temporal frequency change values falls below a predetermined second resetting threshold value. Delayed or controlled resetting of an islanding signal once formed has the advantage of an untimely and possibly premature all-clear signal being avoided.

It is deemed advantageous if the first resetting threshold value matches the frequency threshold value or is less than the frequency threshold value.

The second resetting threshold value preferably matches the frequency change threshold value or is less than the frequency change threshold value.

It is also deemed advantageous if a pre-warning signal indicating possible islanding within the power supply network is generated if the difference between the network frequencies exceeds a predetermined pre-warning threshold value.

For measuring the network frequency and/or the frequency change values in the at least two sections or at the at least two points of the power supply network, it is deemed advantageous if what are known as pointer-type measuring instruments are used. It is therefore deemed advantageous if at least one pointer measured value, the respective frequency value pertaining to the pointer measured value and the respective temporal frequency change value are determined in each case by a pointer-type measuring instrument in the at least two sections or at the at least two points of the power supply network, the frequency values and the frequency change values are transferred to a central device, and the received frequency values and the received frequency change values are evaluated by the central device and the warning signal and/or the islanding signal is/are generated as a function of the received frequency values and/or the received frequency change values.

The phase difference by way of example between the phases of the voltage pointer in the at least two sections, its change (slip) and the change in slip (acceleration) of the voltage pointer are ascertained using the pointer-type measuring instruments.

The invention also relates to an arrangement for monitoring an electrical power supply network. With respect to such an arrangement it is provided according to the invention that arranged in at least two sections or at at least two points at least of the power supply network is at least one measuring instrument respectively which is capable of determining a frequency value indicating the respective network frequency and/or a temporal frequency change value indicating the respective temporal frequency change in the network frequency, and there is a central device which is capable of drawing a conclusion regarding possible islanding within the power supply network and of generating a warning signal indicating the possible islanding within the power supply network if the difference between the frequency change values exceeds a predetermined frequency change threshold value.

Reference is made with respect to the advantages of the inventive arrangement to the above statements in conjunction with the inventive method since the advantages of the inventive arrangement substantially match those of the inventive method.

The central device is preferably a device separate from the measuring instruments and is connected by a communications link to the measuring instruments.

Alternatively the central device can be integrated in a measuring instrument or can form part of one of the measuring instruments.

The invention also relates to a central device for an arrangement as has been described above. According to the invention it is provided with respect to such a central device that the central device has a computing device which is capable of receiving from at least two measuring instruments one temporal frequency change value respectively, indicating the respective temporal frequency change in the network frequency, and/or of determining the temporal frequency change values from measured values of the at least two measuring instruments and of generating a warning signal indicating possible islanding within the power supply network if the difference between the frequency change values exceeds a predetermined frequency change threshold value.

Reference is made with respect to the advantages of the inventive central device to the above statements in conjunction with the inventive method since the advantages of the inventive central device substantially match those of the inventive method.

The invention will be explained in more detail below with reference to exemplary embodiments, in which by way of example:

DESCRIPTION OF THE INVENTION

Figure 1:
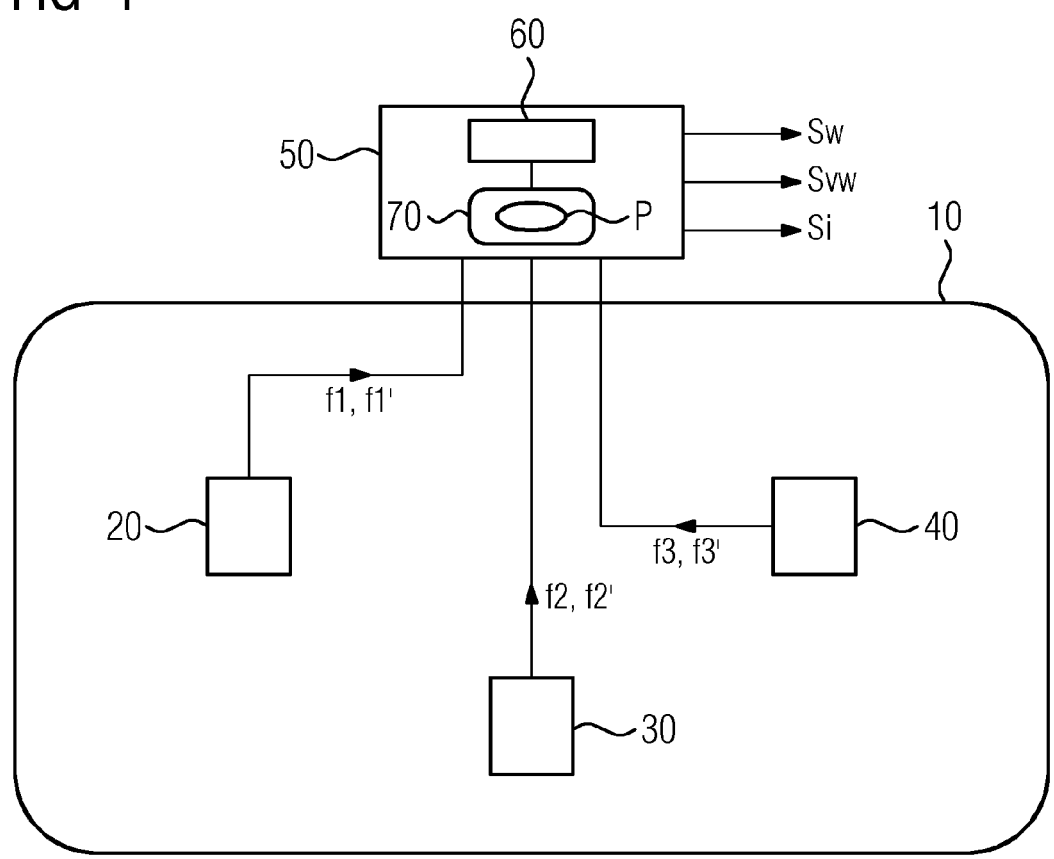
FIG. 1 shows an exemplary embodiment of an arrangement for monitoring an electrical power supply system with measuring instruments and a central device connected to the measuring instruments.

For the sake of clarity, the same reference numerals will always be used in the figures for identical or comparable components.

A power supply network is illustrated only schematically in FIG. 1 and identified by reference numeral 10. Located within the power supply network 10 is a large number of measuring instruments, of which, for reasons of clarity, only three are shown in FIG. 1, and these are identified by reference numerals 20, 30 and 40. The three measuring instruments 20, 30, 40 are located at different points or in different sections of the power supply network 10.

A central device is connected to the three measuring instruments 20, 30, 40, and this includes a computing device 60 and a memory 70. A program P is stored in the memory 70, and this determines the mode of operation of the computing device 60.

The three measuring instruments 20, 30, 40 may by way of example be pointer-type measuring instruments, which are known a PMUs (Phasor Measuring Unit). Pointer-type measuring instruments of this kind are conventionally capable of determining pointer variables (i.e. complex measured values according to amount and phase), such as voltage pointer measured values or current pointer measured values by way of example.

It is assumed by way of example hereinafter that the three measuring instruments 20, 30, 40 each measure the network frequency at the point within the power supply network 10 associated with it and transfer the corresponding frequency values to the central device 50. The frequency values are identified in FIG. 1 by reference numerals f1, f2 and f3.

Furthermore, the three measuring instruments 20, 30, 40 each also ascertain frequency change values f1', f2' and f3' which indicate the temporal frequency change in the network frequency at the respective point in the power supply system 10. The three measuring instruments 20, 30, 40 can form the temporal frequency change values f1', f2' and f3' by way of example by a mathematical derivation of the time-dependent frequency values f1, f2 and f3 with respect to time, i.e. according to $$f1'=df1/dt$$

$$f2'=df2/dt$$

$$f3'=df3/dt$$

The computing device 60 of the central device 50 receives the three frequency values f1, f2 and f3 and the three frequency change values f1', f2' and f3' and at the output side generates a pre-warning signal Svw, a warning signal Sw and/or an islanding signal Si if predetermined criteria are met in the program p and/or in the memory 70.

An exemplary embodiment for the mode of operation of the central device 50 shall be explained below with reference to FIG. 2. It can be seen in FIG. 2 that the central device 50 provides or processes three decision modules, of which a first decision module is identified by the reference numeral 80, a second decision module by the reference numeral 90 and a third decision module by the reference numeral 100.

In the first decision module 80 the central device 50 checks whether the difference between the frequency change values f1', f2' and f3' at the input side exceeds a predetermined frequency change threshold value Df'max or not.

If the first decision module 80 finds that at least one of the three differences exceeds the predetermined frequency change threshold value Df'max, then it generates the warning signal Sw at the output side, by way of example with logic "1".

If, by contrast, the first decision module 80 finds that none of the three differences exceeds the predetermined frequency change threshold value Df'max, then a warning signal Sw by way of example with logic "0" is generated at the output side.

The logic level is therefore allocated by way of example as follows:

$$|f1'-f2'|>Df'\text{max} \Rightarrow Sw="1"$$

$$|f1'-f3'|>Df'\text{max} \Rightarrow Sw="1"$$

$|f2'-f3'|>Df'\max \Rightarrow Sw="1"$ $|f1'-f2'|\leq Df'\max$ and $|f1'-f3'|\leq Df'\max$ and $\leq |f2'-f3'|\leq Df'\max \Rightarrow Sw="0"$ The second decision module 90 checks the three frequency values f1, f2 and f3, which are supplied by the three measuring instruments 20, 30 and 40 according to FIG. 1. It forms differential values between the frequency values and generates the pre-warning signal Svw by way of example with logic "1" if at least one difference between the frequency values exceeds a predetermined pre-warning threshold value Dfpre. If, by contrast, the second decision module 90 finds that none of the differences between the network frequencies exceeds the predetermined pre-warning threshold value Dfpre, then a pre-warning signal Svw is generated at the output side, by way of example with logic "0".

The following applies therefore by way of example for the allocation of the logic signal level:

$|f1-f2|>Df\text{pre} \Rightarrow Svw="1"$ $|f1-f3|>Df\text{pre} \Rightarrow Svw="1"$ $|f2-f3|>Df\text{pre} \Rightarrow Svw="1"$ $|f1-f2|\leq Df\text{pre}$ and $|f1-f3|\leq Df\text{pre}$ and $|f2-f3|\leq Df\text{pre} \Rightarrow Svw="0"$ The third decision module 100 serves to form an islanding signal Si if the frequency values f1, f2 and f3 supplied by the three measuring instruments 20, 30 and 40 according to FIG. 1 suggest islanding; the third decision module 100 assumes this is the case if the differences between the frequency values f1, f2 and f3 are too great. The islanding signal Si is generated by way of example with logic "1" if at least one difference between the frequency values exceeds a predetermined frequency threshold value Dfmax. If, by contrast, the third decision module 100 finds that none of the three differences exceeds the predetermined frequency threshold value Dfmax, then an islanding signal Si with logic "0" is generated at the output side.

Figure 2:
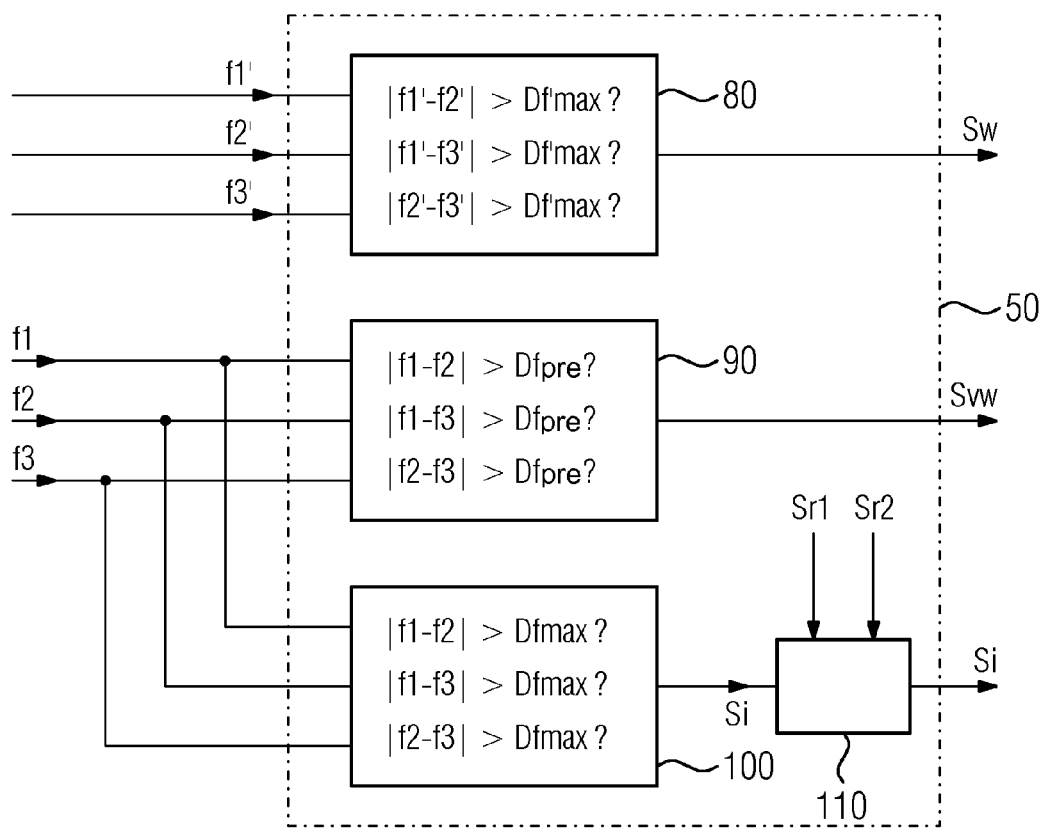
FIG. 2 shows by way of example the mode of operation of the central device of the arrangement according to FIG. 1.

The following applies therefore by way of example for the allocation of the logic signal level:

$|f1-f2|>Df\max \Rightarrow Si="1"$ $|f1-f3|>Df\max \Rightarrow Si="1"$ $|f2-f3|>Df\max \Rightarrow Si="1"$ $|f1-f2|\leq Df\max$ and $|f1-f3|\leq Df\max$ and $|f2-f3|\leq Df\max \Rightarrow Si="1"$ It can be seen in FIG. 2 that a signal memory 110 is downstream of the third decision module 100, and this may be by way of example a flip-flop or the like. The function of the signal memory 110 consists in buffering the islanding signal Si. This shall be explained in more detail below.

If the islanding signal Si is generated with logic "1" by the third decision module 100, then this logic "1" is transferred from the signal memory 110, so the islanding signal Si is output at the output of the signal memory 110 with logic "1".

The logic signal level "1" is stored by the signal memory 110 and passed at the output side even if the islanding signal Si is in the meantime no longer being generated by the third decision module 100. The islanding signal Si output by the signal memory 110 is only reset to logic "0" if both a first resetting signal Sr1 and a second resetting signal Sr2 exhibit logic "1". In other words, only if the output signal generated by the third decision module 100 exhibits logic "0" and at the same time the two resetting signals Sr1 and Sr2 exhibit logic "1" is the signal level of the islanding signal Si reset and the islanding signal Si output with logic "0".

The first resetting signal can be formed by way of example with logic "1" if the difference between the frequency values exceeds a predetermined first resetting threshold value.

The second resetting signal Sr2 can be generated by way of example with logic "1" if the difference between the temporal frequency change values falls below a predetermined second resetting threshold value.

Figure 3:
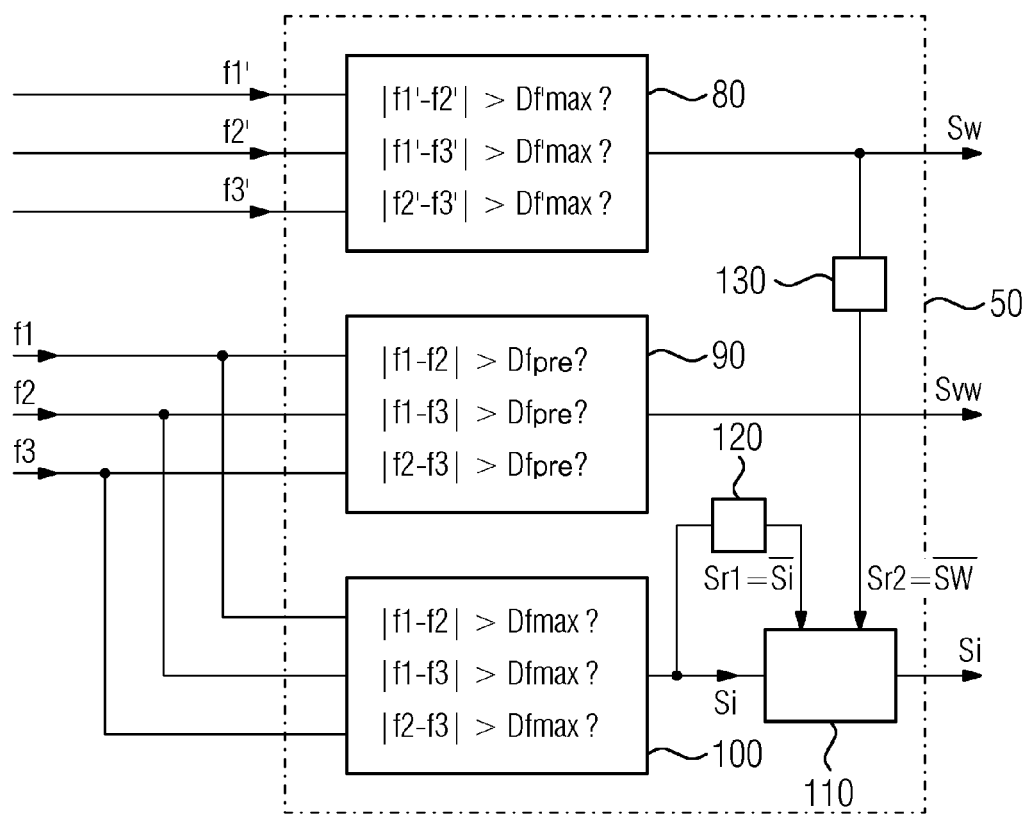
FIG. 3 shows by way of example a formation of resetting signals for the arrangement according to FIG. 1.

FIG. 3 shows by way of example how the two resetting signals Sr1 and Sr2 may be easily formed:

The frequency threshold value Dfmax by way of example, which is used by the third decision module 100, can be employed to form the first resetting signal Sr1. In this case the first resetting signal Sr1 can be easily generated by inverting the islanding signal Si, output by the third decision module 100, by means of an inverter 120. The inverter 120 inverts the islanding signal Si of the third decision module 100 and outputs the inverted islanding signal Si to the signal memory 110 as a first resetting signal Sr1.

In the case of the second resetting signal Sr2 the frequency change threshold value Df'max by way of example can be taken into account, and this is used by the first decision module 80 in the course of generating the warning signal Sw. A second inverter 130 by way of example can invert the output signal of the first decision module 80, i.e. invert the warning signal Sw, and feed the inverted warning signal Sw as a second resetting signal Sr2 into the signal memory 110.

In the course of the described generation of the two resetting signals Sr1 and Sr2, there is a resetting of an islanding signal S1, set previously to logic "1", at the output of the signal memory 110 only if the islanding signal Si emitted at the output side by the third decision module 100 exhibits logic "0" and at the same time the warning signal Sw of the first decision module 80 exhibits logic "0".

The explanations in connection with FIGS. 2 and 3 should be understood only as examples with respect to the logic signal levels of the signals. The signal levels of the signals Sw, Svw, Sr1 and Sr2 can of course also be defined in another way. In this case it is only necessary for the evaluation logic within the central device 50 to be adapted accordingly.

Although the invention has been illustrated and described in detail by preferred exemplary embodiments it is not restricted by the disclosed examples and a person skilled in the art can derive other variations herefrom without departing from the scope of the invention.

LIST OF REFERENCE NUMERALS 10 power supply network
20 measuring instrument
30 measuring instrument
40 measuring instrument
50 central device
60 computing device
70 memory
80 decision module
90 decision module
100 decision module
110 signal memory
120 inverter
130 inverter
Df'max frequency change threshold value
Dfmax frequency threshold value
Dfpre pre-warning threshold value
f1 frequency value
f2 frequency value
f3 frequency value
f1' frequency change value
f2' frequency change value
f3' frequency change value
P program
Si islanding signal
Sr1 resetting signal
Sr2 resetting signal
Sw warning signal
Svw pre-warning signal

The invention claimed is:

1. A method of monitoring an electrical power supply network, the method comprising:
   determining by a measuring instrument a temporal frequency change value for at least two sections of the power supply network or for at least two points of the power supply network, the change value indicating a respective temporal frequency change in a network frequency; and
   if a difference between the frequency change values exceeds a predetermined frequency change threshold value, drawing by a central device a conclusion regarding possible islanding within the power supply network and generating and outputting a warning signal indicating the possible islanding within the power supply network;
   if a difference between the frequency values exceeds a predetermined frequency threshold value, drawing by the central device a conclusion regarding the existence of islanding within the power supply network and generating an islanding signal indicating islanding within the power supply network; and
   after forming the islanding signal by the central device, resetting or switching off the islanding signal only if:
   the difference between the frequency values falls below a predetermined first resetting threshold value; and
   the difference between the temporal frequency change values falls below a predetermined second resetting threshold value.

2. The method according to claim 1, which comprises:
   measuring the network frequencies for each of the at least two sections or the at least two points of the power supply network by forming a time-dependent frequency value; and
   forming a derivative of the time-dependent frequency values with respect to time by forming one of the temporal frequency change values respectively.

3. The method according to claim 1, wherein the first resetting threshold value matches the frequency threshold value or is less than the frequency threshold value.

4. The method according to claim 1, wherein the second resetting threshold value matches the frequency change threshold value or is less than the frequency change threshold value.

5. The method according to claim 1, which comprises generating a pre-warning signal indicating possible islanding within the power supply network if the difference between the frequency values exceeds a predetermined pre-warning threshold value.

6. The method according to claim 1, which comprises:
   determining at least one pointer measured value, the respective frequency value pertaining to the pointer measured value and the respective temporal frequency change values in each case by a pointer-type measuring instrument in the at least two sections or at the at least two points of the power supply network;
   transmitting the frequency values and the frequency change values to the central device; and
   evaluating the received frequency values and the received frequency change values with the central device and generating the warning signal and/or the islanding signal as a function of the received frequency values and the received frequency change values.

7. An arrangement for monitoring an electrical power supply network, the arrangement comprising:
   at least one measuring instrument respectively disposed in each of at least two sections or at each of at least two points of the power supply network, said measuring instruments being configured for determining a frequency value indicating a respective network frequency and/or a temporal frequency change value indicating a respective temporal frequency change in a network frequency; and
   a central device configured:
   to draw a conclusion regarding possible islanding within the power supply network and to generate a warning signal indicating the possible islanding within the power supply network if a difference between the frequency change values exceeds a predetermined frequency change threshold value; and
   to draw a conclusion regarding the existence of islanding within the power supply network and generating an islanding signal indicating islanding within the power supply network if the difference between the frequency values exceeds a predetermined frequency threshold value; and
   after forming the islanding signal, to reset or switch off the islanding signal only if:
   the difference between the frequency values falls below a predetermined first resetting threshold value; and
   the difference between the temporal frequency change values falls below a predetermined second resetting threshold value.

8. The arrangement according to claim 7, wherein said central device is a device separate from said measuring instruments and is connected by a communications link to said measuring instruments.

9. The arrangement according to claim 7, wherein said central device is integrated in a measuring instrument or forms part of one of said measuring instruments.

10. The central device for the arrangement according to claim 7, the central device comprising:
   a computing device configured for receiving from at least two measuring instruments one temporal frequency change value respectively, indicating a respective temporal frequency change in a network frequency, and/or for determining the temporal frequency change values from measured values of the at least two measuring instruments and for generating the warning signal indicating possible islanding within the power supply network if the difference between the frequency change values exceeds the predetermined frequency change threshold value.

11. In an electrical power supply network having measuring instruments disposed to measure in different sections or points of the power supply network frequency values indicating a network frequency and/or a temporal frequency change value indicating a temporal frequency change in the network frequency, a central device, comprising:

a computing device configured for receiving from the measuring instruments, signals representing the network frequency and/or temporal frequency change values for the different sections or points in the power supply network and for generating a warning signal indicating possible islanding within the power supply network if a difference between the frequency change values exceeds a predetermined frequency change threshold value, and for generating an islanding signal indicating islanding within the power supply network if the difference between the frequency values exceeds a predetermined frequency threshold value, and, after forming the islanding signal, resetting or switching off the islanding signal only if:

the difference between the frequency values falls below a predetermined first resetting threshold value; and the difference between the temporal frequency change values falls below a predetermined second resetting threshold value.

* * * * *